(12) United States Patent
Kim et al.

(10) Patent No.: US 12,210,045 B2
(45) Date of Patent: Jan. 28, 2025

(54) IMPEDANCE MEASUREMENT JIG AND METHOD OF CONTROLLING A SUBSTRATE-PROCESSING APPARATUS USING THE JIG

(71) Applicant: SAMSUNG ELECTRONICS CO., LTD., Suwon-si (KR)

(72) Inventors: Byeongsang Kim, Hwaseong-si (KR); Dougyong Sung, Seoul (KR); Sungjin Kim, Suwon-si (KR); Yunhwan Kim, Hwaseong-si (KR); Inseok Seo, Hwaseong-si (KR); Seungbo Shim, Seoul (KR); Naohiko Okunishi, Hwaseong-si (KR); Minyoung Hur, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 434 days.

(21) Appl. No.: 17/591,751

(22) Filed: Feb. 3, 2022

(65) Prior Publication Data

US 2023/0010881 A1    Jan. 12, 2023

(30) Foreign Application Priority Data

Jul. 7, 2021    (KR) .......................... 10-2021-0088908

(51) Int. Cl.
*G01R 27/16*    (2006.01)
*C23C 16/455*    (2006.01)
(Continued)

(52) U.S. Cl.
CPC ........ *G01R 27/16* (2013.01); *C23C 16/45536* (2013.01); *C23C 16/52* (2013.01);
(Continued)

(58) Field of Classification Search
None
See application file for complete search history.

(56) References Cited

U.S. PATENT DOCUMENTS 6,452,408 B1    9/2002  Nakano et al.
10,649,006 B2    5/2020  Long et al.
(Continued)

FOREIGN PATENT DOCUMENTS

KR    10-2006-0059550 A    6/2006
KR    10-2019-0032969 A    3/2019
(Continued)

*Primary Examiner* — Khaja Ahmad
(74) *Attorney, Agent, or Firm* — Muir Patent Law, PLLC

(57) ABSTRACT

An impedance measurement jig may include a first contact plate, a second contact plate, a cover plate, a plug, and an analyzer. The first contact plate may make electrical contact with an ESC in a substrate-processing apparatus. The second contact plate may make electrical contact with a focus ring configured to surround the ESC. The cover plate may be configured to cover an upper surface of the substrate-processing apparatus. The plug may be installed at the cover plate to selectively make contact with the first contact plate or the second contact plate. The analyzer may individually apply a power to the first contact plate and the second contact plate through the plug to measure an impedance of the ESC and an impedance of the focus ring. Thus, the impedances of the ESC and the focus ring may be individually measured to inspect the ESC and/or the focus ring.

16 Claims, 11 Drawing Sheets

(51) Int. Cl.
*C23C 16/52* (2006.01)
*H01L 21/66* (2006.01)
*H01L 21/67* (2006.01)
*H01L 21/683* (2006.01)

(52) U.S. Cl.
CPC .... *H01L 21/67253* (2013.01); *H01L 21/6833* (2013.01); *H01L 22/14* (2013.01)

(56) References Cited

U.S. PATENT DOCUMENTS

| | | | |
|---|---|---|---|
| 2003/0033116 A1* | 2/2003 | Brcka | H01L 21/6831 |
| | | | 702/182 |
| 2008/0084650 A1 | 4/2008 | Balasubramanian et al. | |
| 2008/0238440 A1* | 10/2008 | Yamazawa | G01R 27/02 |
| | | | 324/600 |
| 2010/0282414 A1 | 11/2010 | Itabashi et al. | |

FOREIGN PATENT DOCUMENTS

| KR | 10-2020-0072688 A | 6/2020 |
|---|---|---|
| KR | 10-2190926 B1 | 12/2020 |

* cited by examiner

IMPEDANCE MEASUREMENT JIG AND METHOD OF CONTROLLING A SUBSTRATE-PROCESSING APPARATUS USING THE JIG

CROSS-REFERENCE TO RELATED APPLICATION

This application claims priority under 35 U.S.C. § 119 to Korean Patent Application No. 10-2021-0088908, filed on Jul. 7, 2021, in the Korean Intellectual Property Office (KIPO), the contents of which are herein incorporated by reference in their entirety.

BACKGROUND

1. Field

Example embodiments relate to an impedance measurement jig and a method of controlling a substrate-processing apparatus using the jig.

2. Description of the Related Art

Generally, a substrate-processing apparatus may form a layer on a semiconductor substrate, or etch a layer on the semiconductor substrate to form a pattern, using plasma.

SUMMARY

According to an embodiment, an impedance measurement jig may include a first contact plate, a second contact plate, a cover plate, a plug, and an analyzer. The first contact plate may make electrical contact with an ESC in a substrate-processing apparatus. The second contact plate may make electrical contact with a focus ring configured to surround the ESC. The cover plate may be configured to cover an upper surface of the substrate-processing apparatus. The plug may be installed at the cover plate to selectively make contact with the first contact plate or the second contact plate. The analyzer may individually apply a power to the first contact plate and the second contact plate through the plug to measure an impedance of the ESC and an impedance of the focus ring.

According to an embodiment, a method of controlling a substrate-processing apparatus may include applying power to a first contact plate configured to make electrical contact with an ESC in the substrate-processing apparatus to measure an impedance of the ESC. A power may be applied to a second contact plate configured to make electrical contact with a focus ring surrounding the ESC to measure an impedance of the focus ring. Whether a ratio between the impedance of the ESC and the impedance of the focus ring may be within an allowable range or not may be determined.

BRIEF DESCRIPTION OF THE DRAWINGS

Features will become apparent to those of skill in the art by describing in detail example embodiments with reference to the attached drawings in which.

DETAILED DESCRIPTION

Figure 1:
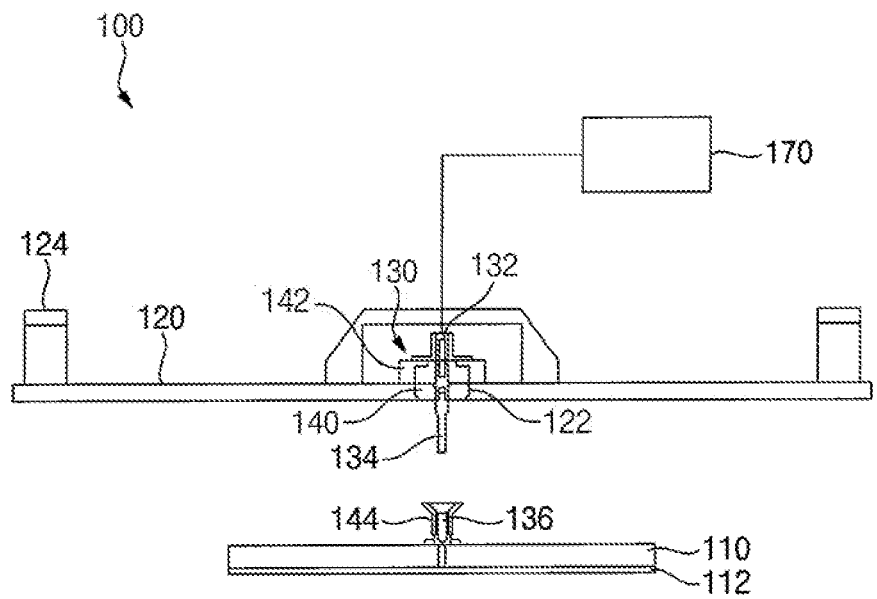
FIG. 1 is a cross-sectional view illustrating an impedance measurement jig including a first contact plate in accordance with example embodiments.
Figure 2:
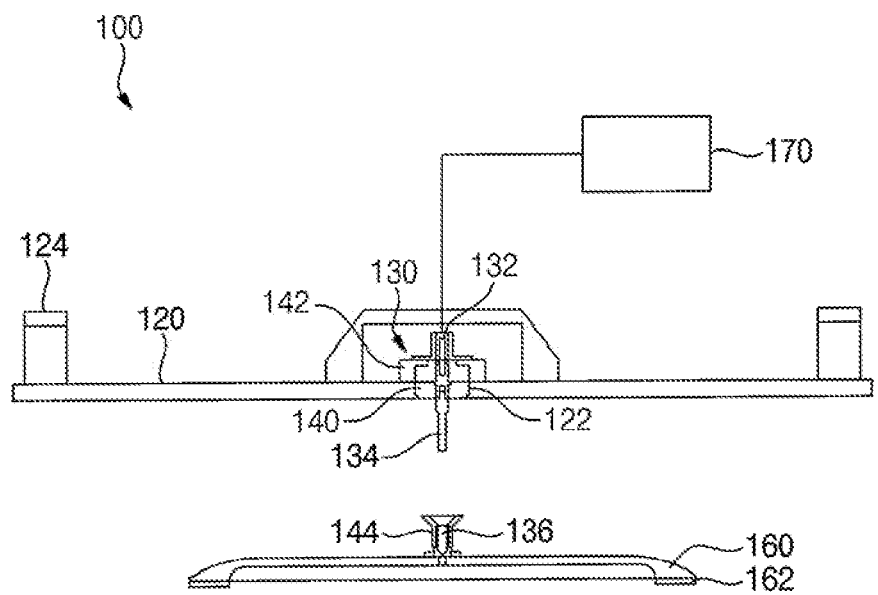
FIG. 2 is a cross-sectional view illustrating an impedance measurement jig including a second contact plate in accordance with example embodiments.
Figure 3:
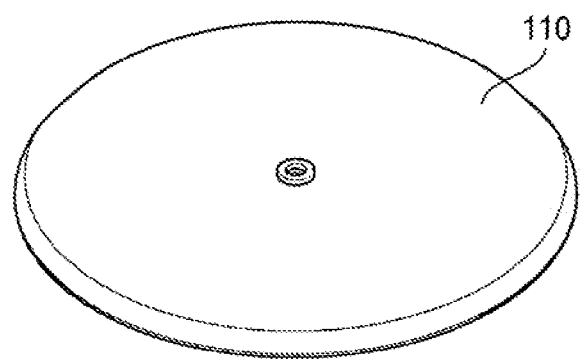
FIG. 3 is a perspective view illustrating the first contact plate in FIG. 1.
Figure 4:
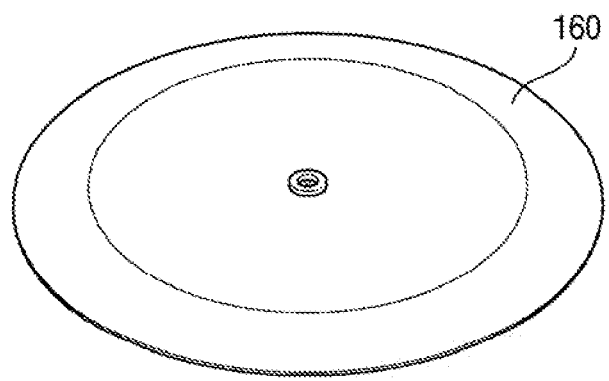
FIG. 4 is a perspective view illustrating the second contact plate in FIG. 2.
Figure 5:
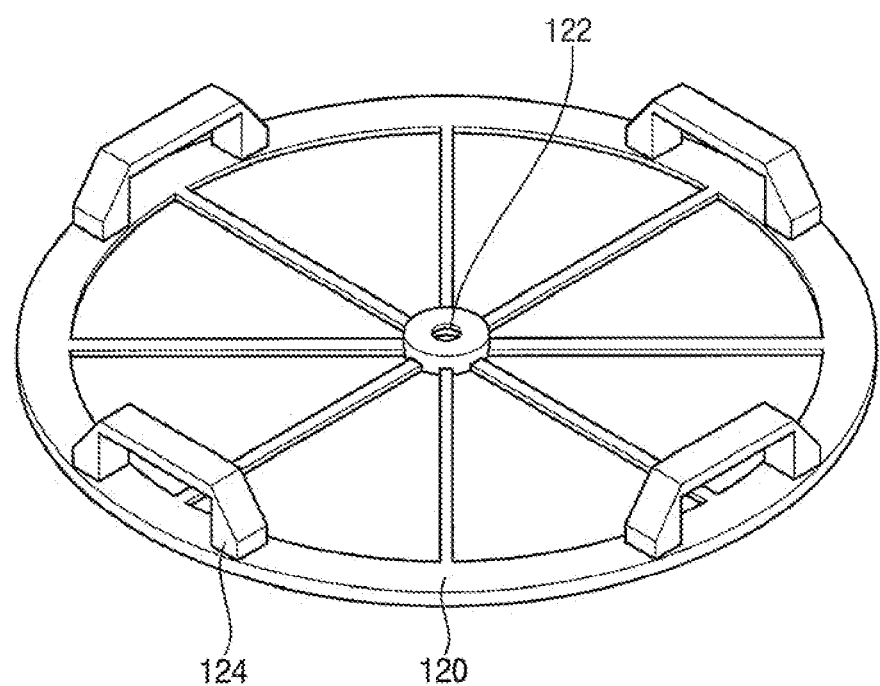
FIG. 5 is a perspective view illustrating a cover plate of the impedance measurement jig in FIG. 1.
Figure 6:
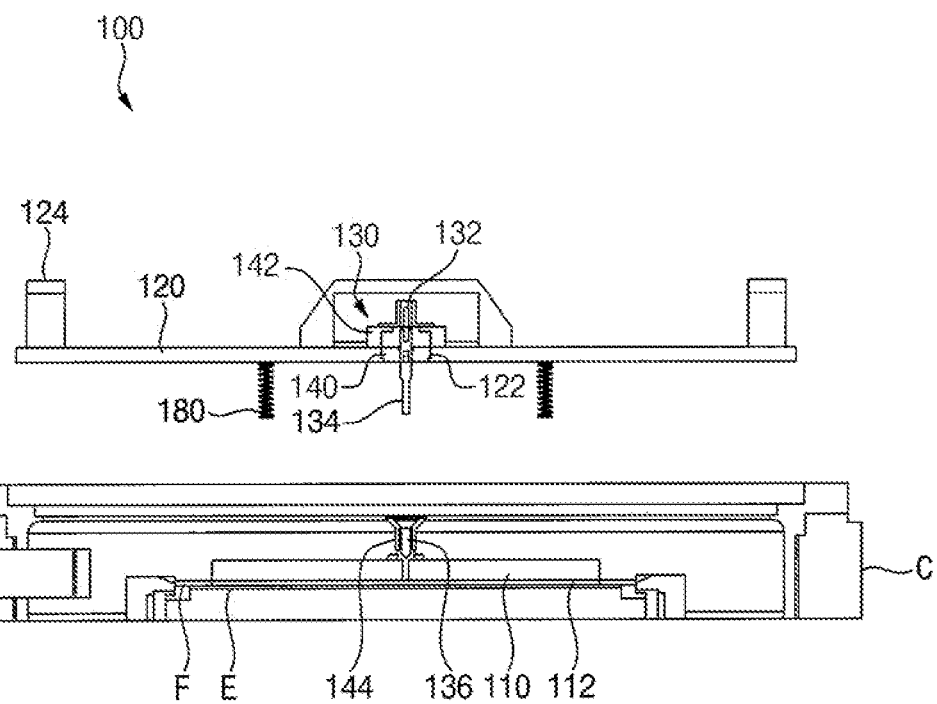
FIG. 6 is an exploded cross-sectional view illustrating the impedance measurement jig in FIG. 1 applied to a substrate-processing apparatus.

FIG. 1 is a cross-sectional view illustrating an impedance measurement jig including a first contact plate in accordance with example embodiments, FIG. 2 is a cross-sectional view illustrating an impedance measurement jig including a second contact plate in accordance with example embodiments, FIG. 3 is a perspective view illustrating the first contact plate in FIG. 1, FIG. 4 is a perspective view illustrating the second contact plate in FIG. 2, FIG. 5 is a perspective view illustrating a cover plate of the impedance measurement jig in FIG. 1, and FIG. 6 is an exploded cross-sectional view illustrating the impedance measurement jig in FIG. 1 applied to a substrate-processing apparatus.

Referring first to the substrate-processing apparatus illustrated in FIG. 6, and as explained further below, an impedance measurement jig 100 according to an example embodiment may individually measure respective impedances of parts in the substrate-processing apparatus, rather than simply measuring a total impedance of the entire substrate-processing apparatus.

Referring to FIG. 6, the substrate-processing apparatus may include a plasma-processing apparatus. The plasma-processing apparatus may be configured to process a semiconductor substrate using plasma. For example, the substrate-processing apparatus may form a layer on the semiconductor substrate, or etch a layer that is present on the semiconductor substrate, using the plasma.

The substrate-processing apparatus may include a chamber C in which the plasma may be generated, an electrostatic chuck E (ESC E) arranged in the chamber C to support the semiconductor substrate, a focus ring F configured to surround the ESC E, etc.

The impedance measurement jig 100 according to the present example embodiment may selectively measure impedances of the ESC E and the focus ring F. Thus, the impedance measurement jig 100 may be applied to apparatuses configured to process a substrate using the ESC E and the focus ring F.

Referring now to FIGS. 1 and 2, the impedance measurement jig 100 according to the present example embodiment may include a first contact plate 110, a second contact plate 160, a cover plate 120, a plug 130, and an analyzer 170.

The impedance measurement jig 100 may selectively include the first contact plate 110 and the second contact plate 160. The impedance measurement jig 100 may selectively include any one of the first contact plate 110 and the second contact plate 160 in accordance with cases for measuring the impedances of the ESC E and the focus ring F. For example, the impedance measurement jig 100 in FIG. 1 may be used for measuring the impedance of the ESC E. As another example, the impedance measurement jig 100 in FIG. 2 may be used for measuring the impedance of the focus ring F.

The impedance measurement jig 100 in FIG. 1, which may be used for measuring the impedance of the ESC E, may include the first contact plate 110, the cover plate 120, the plug 130 and the analyzer 170, and may not include the second contact plate 160.

Referring to FIGS. 1 and 3, the first contact plate 110 may be configured to make contact with an upper surface of the ESC E. The first contact plate 110 may have a lower surface configured to make contact with the whole upper surface of the ESC E. The lower surface of the first contact plate 110 may be a flat surface. The ESC E may have a circular plate shape, and thus the first contact plate 110 may also have a circular plate shape.

The first contact plate 110 may include a conductive material such as a metal, for example. Further, the first contact plate 110 may include a flexible material or a non-flexible material.

When the first contact plate 110 is downwardly moved for measuring the impedance of the ESC E, the first contact plate 110 may make contact with the ESC E, but in such a case the ESC E may be damaged by the first contact plate 110. In order to prevent the damage of the ESC E, a protection film 112 may be attached to the lower surface of the first contact plate 110.

Because the whole lower surface of the first contact plate 110 may make contact with the upper surface of the ESC E, the protection film 112 may have a size for covering the whole lower surface of the first contact plate 110. Thus, the protection film 112 on the lower surface of the first contact plate 110 may have a circular shape.

The protection film 112 may include polyimide, for example.

The impedance measurement jig 100 in FIG. 2, which may be used for measuring the impedance of the focus ring F, may include the second contact plate 160, the cover plate 120, the plug 130, and the analyzer 170, and may not include the first contact plate 110.

After measuring the impedance of the ESC E using the impedance measurement jig 100 in FIG. 1, the first contact plate 110 may be exchanged with the second contact plate 160. The impedance of the focus ring F may then be measured using the impedance measurement jig 100 in FIG. 2 including the second contact plate 160.

Referring to FIGS. 2 and 4, the second contact plate 160 may be configured to make contact with an upper surface of the focus ring F, but it may be important to prevent contact between the second contact plate 160 and the upper surface of the ESC E positioned at a central portion of the focus ring F. Thus, the second contact plate 160 may include an edge portion, which is configured to make contact with the focus ring F, and a central portion positioned over the ESC E. In order to prevent the contact between the second contact plate 160 and the ESC E, the edge portion of the second contact plate 160 may be positioned lower than the central portion of the second contact plate 160.

The second contact plate 160 may include a conductive material such as a metal, for example. Further, the second contact plate 160 may include a flexible material or a non-flexible material.

When the second contact plate 160 is downwardly moved for measuring the impedance of the focus ring F, the second contact plate 160 may make contact with the focus ring F, but in such a case the focus ring F may be damaged by the second contact plate 160. In order to prevent the damage of the focus ring F, a protection film 162 may be attached to the edge portion of the lower surface of the second contact plate 160.

Because the central portion of the lower surface of the second contact plate 160 may not make contact with the focus ring F, the protection film 162 may not be attached to or provided to the central portion of the lower surface of the second contact plate 160. Thus, the protection film 162 on the lower surface of the second contact plate 160 may have a circular shape or an annular shape.

The protection film 112 may include polyimide, for example.

Referring to FIGS. 1, 2 and 5, the cover plate 120 may be arranged on an upper surface of the chamber C in the substrate-processing apparatus to cover the chamber C. The cover plate 120 may function as a ground in measuring the impedances of the ESC E and the focus ring F. The cover plate 120 may be used commonly for measuring the impedances of the ESC E and the focus ring F.

The impedance of the ESC E may be determined as an impedance between the first contact plate 110 on the upper surface of the ESC E and the cover plate 120 on the upper surface of the chamber C.

The impedance of the focus ring F may be determined as an impedance between the second contact plate 160 on the upper surface of the focus ring F and the cover plate 120 on the upper surface of the chamber C.

The chamber C may have a cylindrical shape. Thus, the cover plate 120 configured to cover the upper surface of the chamber C may have a circular plate shape.

Handles 124 for easily holding the cover plate 120 by a worker may be installed at an upper surface of the cover plate 120. Further, in order to reduce a weight of the cover plate 120, an indented portion such as a rib may be formed at the upper surface of the cover plate 120.

The cover plate 120 may include a flexible material or a non-flexible material.

Referring to FIGS. 1 and 2, a hole 122 may be formed through a central portion of the cover plate 120, and the plug 130 may be received in the hole 122. The plug 130 may apply a power to the first contact plate 110 or the second contact plate 160. The plug 130 may be used commonly for measuring the impedances of the ESC E and the focus ring F.

The plug 130 may include a first connector 132, a second connector 134, a third connector 136, a first holder 140, a second holder 142 and a guide 144.

The first connector 132 may be received in the hole 122. The first connector 132 may be electrically coupled to the analyzer 170. The first connector 132 may include an RF connector, for example.

The second connector 134 may be arranged under the first connector 132. The second connector 134 may be electrically connected to the first connector 132. Thus, an upper end of the second connector 134 may make electrical contact with a lower end of the first connector 132. The second connector 134 may include an RF connector, for example.

The first holder 140 may be configured to fix the second connector 134 to the cover plate 120. For example, the first holder 140 may hold the second connector 134. The first holder 140 may be combined with an inner surface of the hole 122.

The second holder 142 may fix the first connector 132 to the first holder 140. For example, the second holder 142 may hold the first connector 132. The second holder 142 may be threadedly combined with an outer surface of the first holder 140.

The third connector 136 may be installed at the upper surface of the first contact plate 110 and the central portion of the upper surface of the second contact plate 160. The third connector 136 may be electrically connected to the second connector 134. An upper end of the third connector 136 may make electrical contact with a lower end of the second connector 134. The third connector 136 may include an RF connector, for example.

The first connector 132, the second connector 134, and the third connector 136 may include a copper core plated by gold, for example.

The guide 144 may be configured to surround the third connector 136. The guide 144 may have a funnel shape configured to guide the lower end of the second connector 134 toward the upper end of the third connector 136.

In example embodiments, the plug 130 may be integrally formed with the cover plate 120. The plug 130 may be integrally formed with the cover plate 120 by fixing the first holder 140 to the cover plate 120. For example, the outer surface of the first holder 140 may closely make contact with the inner surface of the hole 122. Thus, the plug 130 may be moved together with the cover plate 120.

The analyzer 170 may individually apply the power to the first contact plate 110 and the second contact plate 160 through the plug 130. Thus, the analyzer 170 may be electrically connected to the plug 130. For example, the analyzer 170 may be electrically connected to the upper end of the first connector 132 in the plug 130 via a cable.

The analyzer 170 may individually apply the power to the first contact plate 110 and the second contact plate 160 to measure the impedance of the ESC E and the impedance of the focus ring F.

A reference impedance of the ESC E and a reference impedance of the focus ring F may be stored in the analyzer 170. Further, an allowable range (for determining whether a ratio between the reference impedance of the ESC E and the reference impedance of the focus ring F is normal or not) may be set in the analyzer 170. The analyzer 170 may determine whether a ratio between the impedance of the ESC E measured using the first contact plate 110 and the impedance of the focus ring F measured using the second contact plate 160 is within the allowable range or not.

The reference impedances set in the analyzer 170 may be impedances of the ESC E and the focus ring F showing an optical plasma distribution under set process conditions. The allowable range may be set from a reference ratio between the reference impedance of the ESC E and the reference impedance of the focus ring F. The reference impedances and the allowable range may be changed in accordance with the process conditions.

When a measured impedance ratio is within the allowable range, the analyzer 170 may determine the ESC E and the focus ring F to be normal. In contrast, when a measured impedance ratio is beyond the allowable range, the analyzer 170 may determine the ESC E and/or the focus ring F to be abnormal, in which case inspections for the ESC E and/or the focus ring F may be performed.

Figure 7:
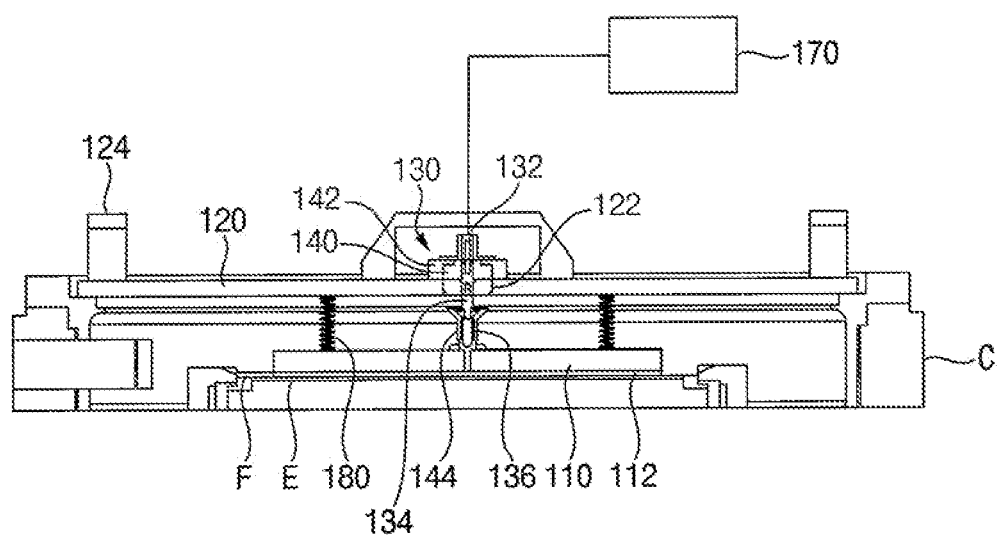
FIG. 7 is a cross-sectional view illustrating the impedance measurement jig in FIG. 6 applied to the substrate-processing apparatus.

Referring again to FIG. 6 as well as FIG. 7, in order to measure the impedance of the ESC E, the first contact plate 110 may enter into the chamber C through the upper surface of the chamber C. The first contact plate 110 may be placed on the upper surface of the ESC E. The whole lower surface of the first contact plate 110 may make contact with the upper surface of the ESC E. In contrast, the first contact plate 110 may not make contact with the focus ring F.

The cover plate 120 with the plug 130 may be arranged on the upper surface of the chamber C. The second connector 134 of the plug 130 may be downwardly moved to be electrically contacted with the third connector 136 on the upper surface of the first contact plate 110. Thus, the ESC E may be electrically connected with the analyzer 170 via the first contact plate 110 and the plug 130. The downward movement of the second connector 134 may be guided by the guide 144 toward the third connector 136.

The analyzer 170 may apply the power to the ESC E through the plug 130 and the first contact plate 110. The analyzer 170 may measure the impedance between the first contact plate 110 and the cover plate 120, i.e., the impedance of the ESC E.

When the impedance measurement of the ESC E is complete, the cover plate 120 may be detached from the upper surface of the chamber C.

It is possible that, during the detaching process, the cover plate 120 may not be readily detached from the first contact plate 110, which may damage the ESC E. In order to prevent the damage of the ESC E, at least one resilient member 180 may be installed at the lower surface of the cover plate 120.

The resilient member 180 may be configured to downwardly support the first contact plate 110. Thus, the resilient member 180 may resiliently support the first contact plate 110 in the downward direction opposite to a detaching direction of the cover plate 120, so that the cover plate 120 may be readily detached from the first contact plate 110. As a result, the ESC E may not be damaged during the detaching process. After completing the detaching process of the cover plate 120, the first contact plate 110 may be unloaded from the chamber C.

The resilient member 180 may be or include a spring, for example.

Figure 8:
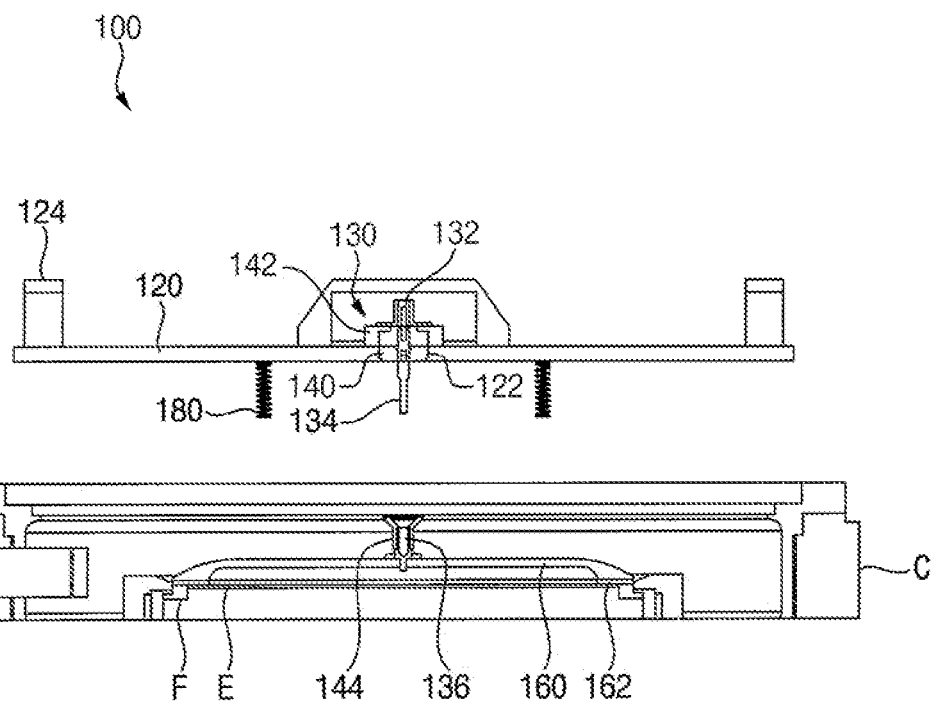
FIG. 8 is an exploded cross-sectional view illustrating the impedance measurement jig in FIG. 2 applied to a substrate-processing apparatus.
Figure 9:
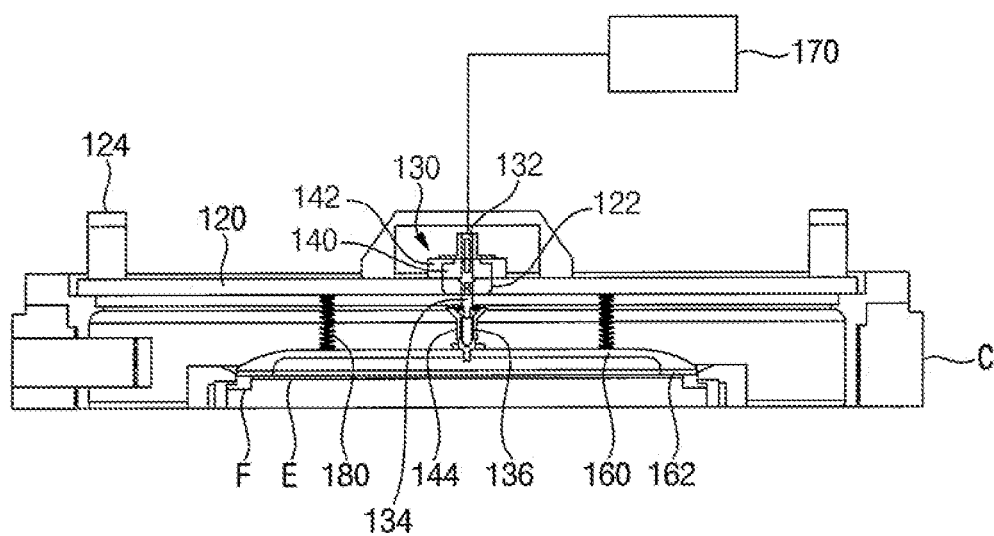
FIG. 9 is a cross-sectional view illustrating the impedance measurement jig in FIG. 8 applied to the substrate-processing apparatus.

Referring to FIGS. 8 and 9, in order to measure the impedance of the focus ring F, the second contact plate 160 may enter into the chamber C through the upper surface of the chamber C. The second contact plate 160 may be placed on the upper surface of the focus ring F. The lower surface of the second contact plate 160 may make contact with the upper surface of the focus ring F, but the second contact plate 160 may not make contact with the ESC E.

The cover plate 120 with the plug 130 may be arranged on the upper surface of the chamber C. The second connector 134 of the plug 130 may be downwardly moved to be electrically contacted with the third connector 136 on the upper surface of the second contact plate 160. Thus, the focus ring F may be electrically connected with the analyzer 170 via the second contact plate 160 and the plug 130. The downward movement of the second connector 134 may be guided by the guide 144 toward the third connector 136.

The analyzer 170 may apply the power to the focus ring F through the plug 130 and the second contact plate 160. The analyzer 170 may measure the impedance between the second contact plate 160 and the cover plate 120, i.e., the impedance of the focus ring F.

Figure 10:
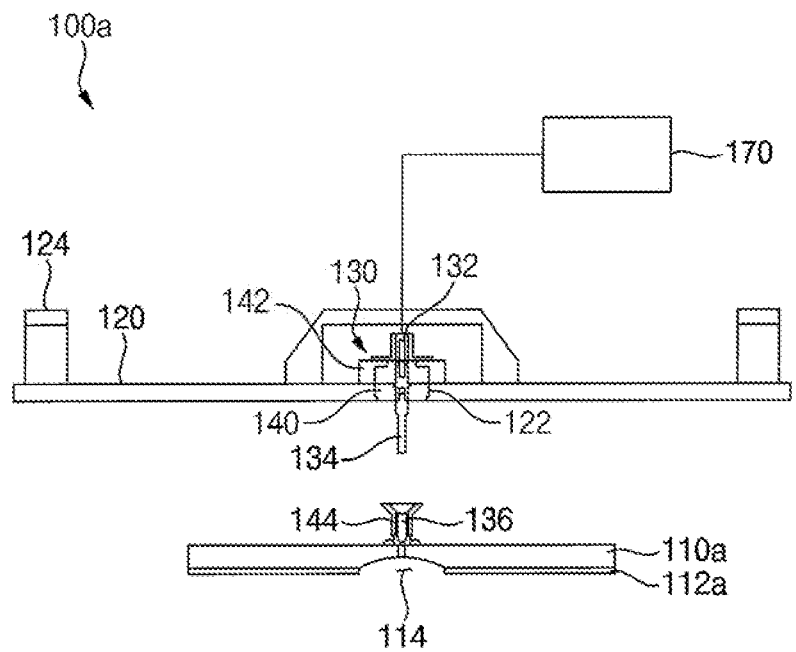
FIG. 10 is a cross-sectional view illustrating an impedance measurement jig in accordance with example embodiments.

FIG. 10 is a cross-sectional view illustrating an impedance measurement jig in accordance with example embodiments.

An impedance measurement jig 100a of this example embodiment may include elements substantially the same as those of the impedance measurement jig 100 in FIG. 1 except for a first contact plate. Thus, the same reference numerals may refer to the same elements and any further illustrations with respect to the same elements may be omitted herein for brevity.

In order to accurately measure the impedance of the ESC E, it may be important to accurately connect the plug 130 with the first contact plate 110. Thus, it may be important to accurately connect the lower end of the second connector 134 with the upper end of the third connector 136. However, the ESC E in the substrate-processing apparatus may have a height that is different from a designed height (e.g., due to an assembly tolerance, a thickness error, etc., of the ESC E). In this case, the second connector 134 may not be connected or may not be fully connected to the third connector 136.

In example embodiments, because the thickness of the ESC E and a length of the plug 130 may be fixed, a height of the third connector 136 may be corrected using a first contact plate 110a.

Referring to FIG. 10, the first contact plate 110a may include a flexible material. Further, the first contact plate 110a may include a height-correcting groove 114. The height-correcting groove 114 may be formed at a central portion of a lower surface of the first contact plate 110a, for example. The height-correcting groove 114 may be spaced apart from the upper surface of the ESC E. For example, the height-correcting groove 114 may be formed at an edge portion of the lower surface of the first contact plate 110a, or an upper surface of the first contact plate 110a.

The flexible first contact plate 110a may be moved in the height-correcting groove 114 along the upward and downward directions. Thus, the third connector 136 on the upper surface of the first contact plate 110a may also be moved in the upward and downward directions to correct the height of the third connector 136 by the height-correcting groove 114.

An inner surface of the height-correcting groove 114 may not make contact with the upper surface of the ESC E. Thus, a protection film 112a may be attached to only a portion of the lower surface of the first contact plate 110a that is configured to make contact with the upper surface of the ESC E. In example embodiments, because the height-correcting groove 114 may be formed at the central portion of the lower surface of the first contact plate 110a, the protection film 112a may have an annular shape configured to surround the height-correcting groove 114.

Figure 11:
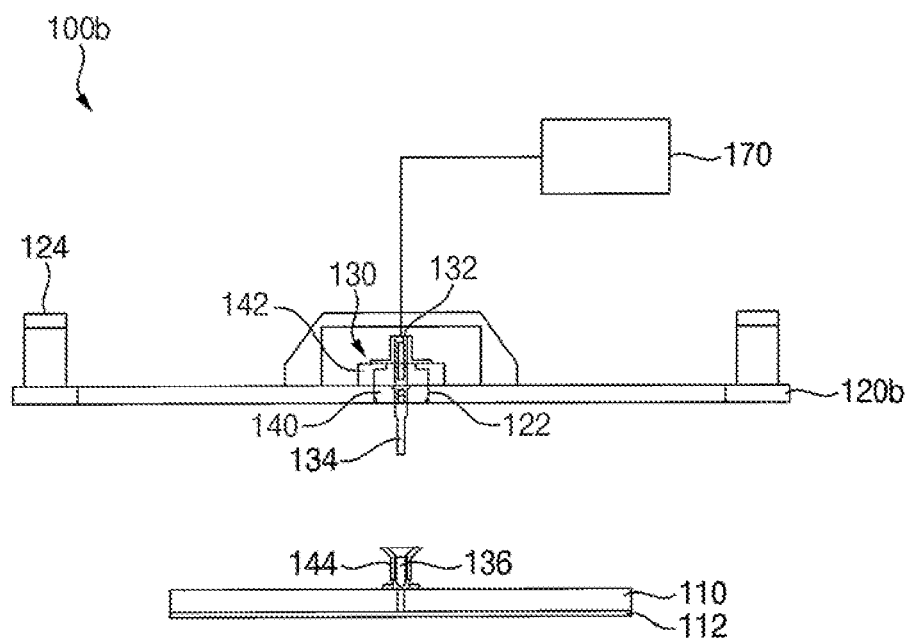
FIG. 11 is a cross-sectional view illustrating an impedance measurement jig in accordance with example embodiments.
Figure 12:
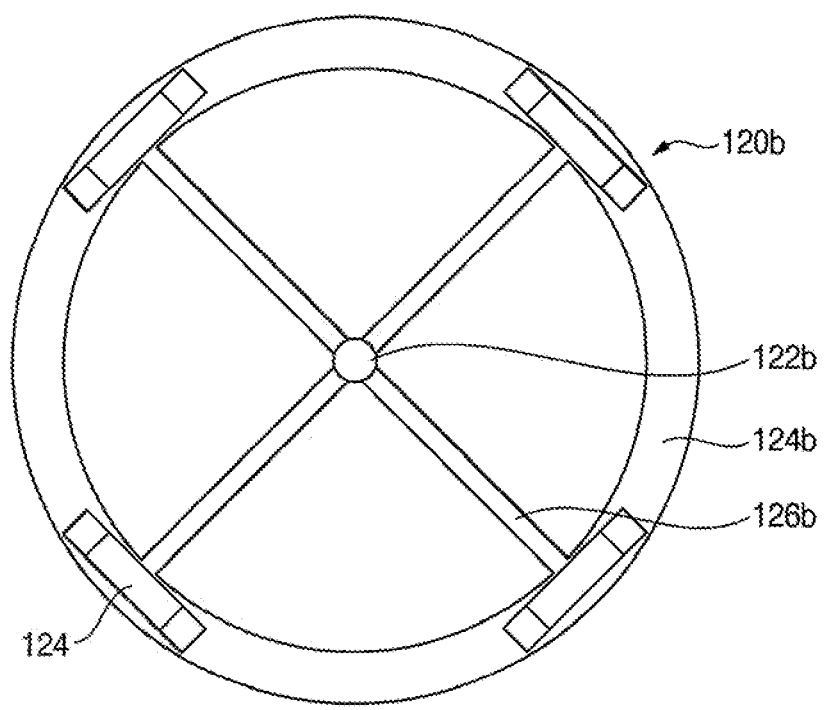
FIG. 12 is a perspective view illustrating a cover plate of the impedance measurement jig in FIG. 11.

FIG. 11 is a cross-sectional view illustrating an impedance measurement jig in accordance with example embodiments, and FIG. 12 is a perspective view illustrating a cover plate of the impedance measurement jig in FIG. 11.

An impedance measurement jig 100b of this example embodiment may include elements substantially the same as those of the impedance measurement jig 100 in FIG. 1 except for a cover plate. Thus, the same reference numerals may refer to the same elements and any further illustrations with respect to the same elements may be omitted herein for brevity.

Referring to FIGS. 11 and 12, a cover plate 120b may include a flexible material. The flexible cover plate 120b may include a central plate 122b, a rim 124b, and a plurality of ribs 126b.

The rim 124b may be configured to surround the central plate 122b. The ribs 126b may be radially extended from the central plate 122b. The ribs 126b may be connected to the rim 124b.

The hole 122 configured to receive the plug 130 may be formed through the central plate 122b. Because the rim 124b may be fixed to the upper surface of the chamber C and the ribs 126b may include the flexible material, the central plate 122b may be moved in the upward and downward directions. Thus, a height of the second connector 134 in the plug 130 at the central plate 122b may be corrected by the upward and downward movements of the central plate 122b.

Figure 13:
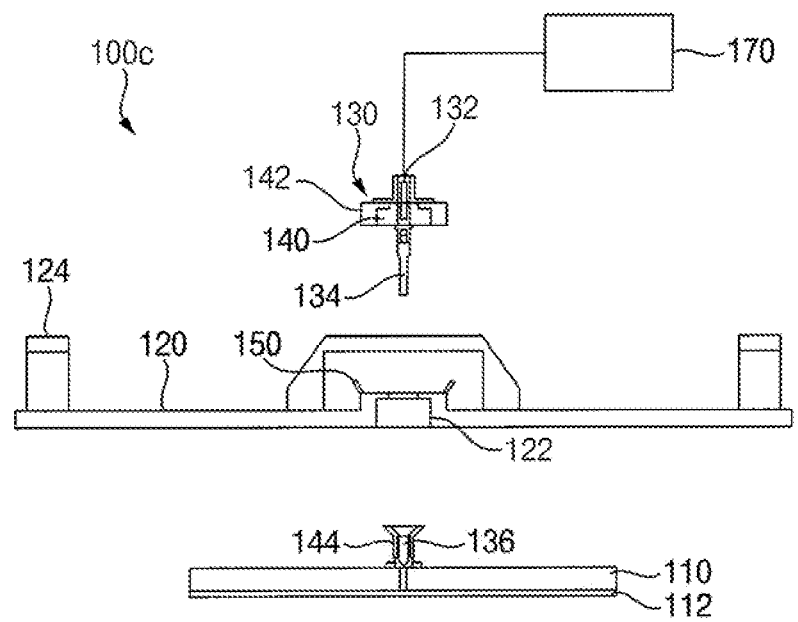
FIG. 13 is a cross-sectional view illustrating an impedance measurement jig including a first contact plate in accordance with example embodiments.
Figure 14:
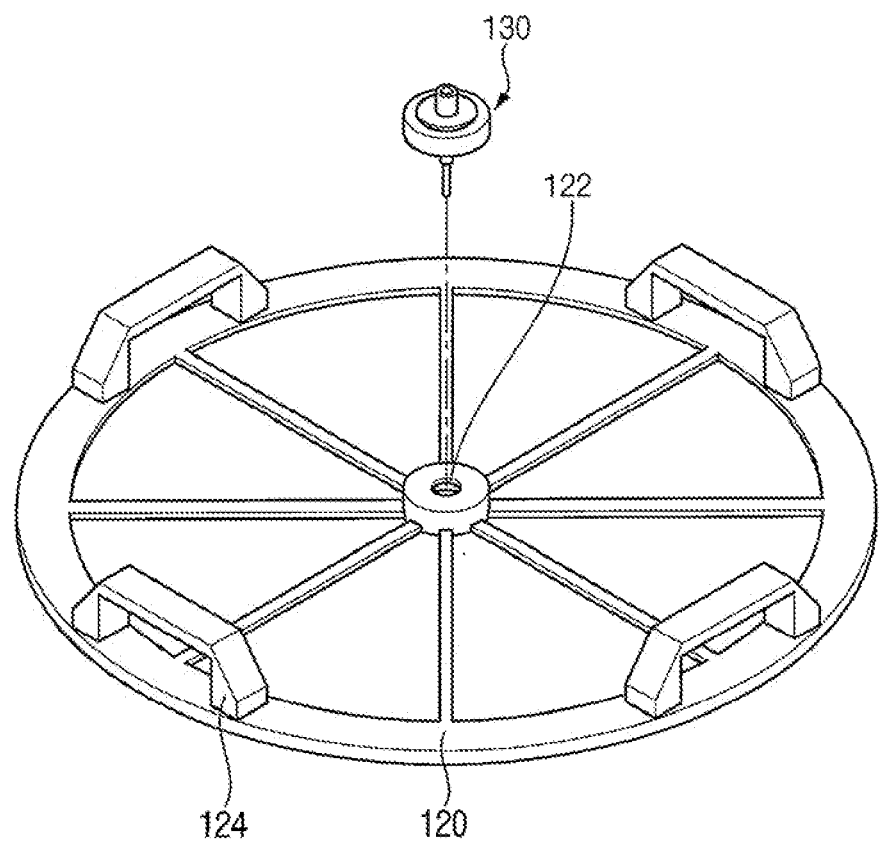
FIG. 14 is an exploded perspective view illustrating a cover plate and a plug of the impedance measurement jig in FIG. 13.
Figure 15:
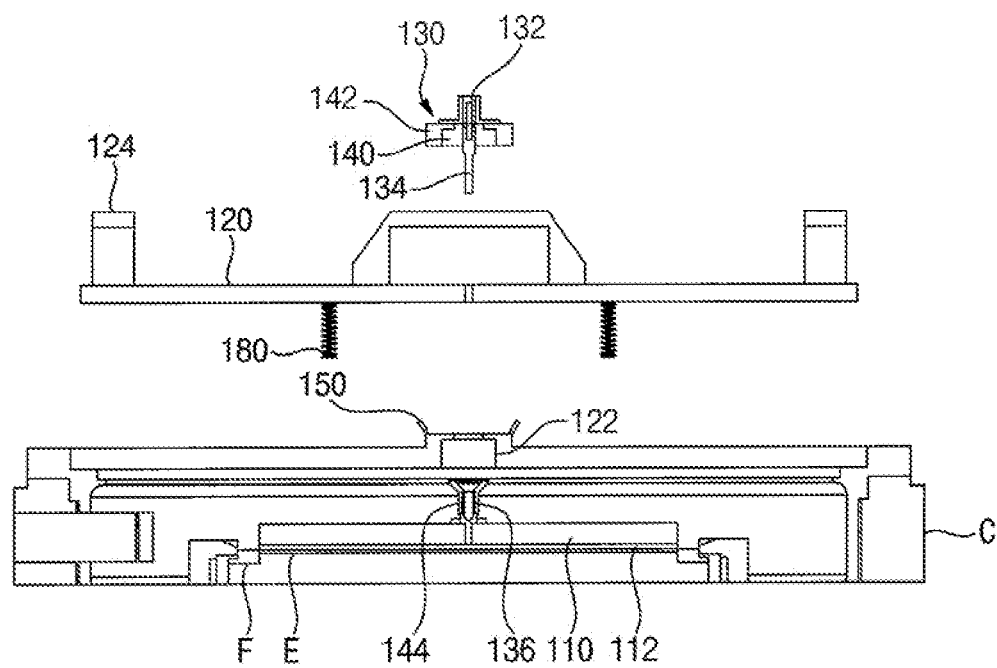
FIG. 15 is an exploded cross-sectional view illustrating the impedance measurement jig in FIG. 13 applied to the substrate-processing apparatus.
Figure 16:
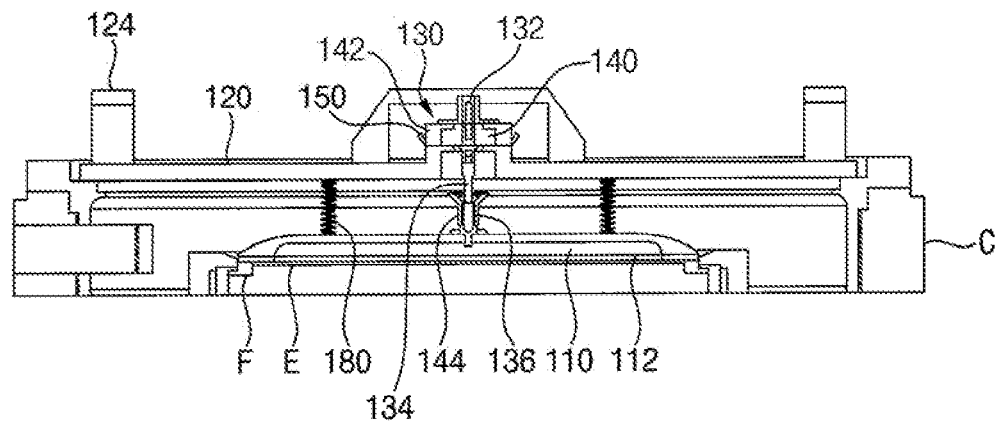
FIG. 16 is a cross-sectional view illustrating the impedance measurement jig in FIG. 15 combined with the substrate-processing apparatus.

FIG. 13 is a cross-sectional view illustrating an impedance measurement jig including a first contact plate in accordance with example embodiments, FIG. 14 is an exploded perspective view illustrating a cover plate and a plug of the impedance measurement jig in FIG. 13, FIG. 15 is an exploded cross-sectional view illustrating the impedance measurement jig in FIG. 13 applied to the substrate-processing apparatus, and FIG. 16 is a cross-sectional view illustrating the impedance measurement jig in FIG. 15 combined with the substrate-processing apparatus.

An impedance measurement jig 100c of this example embodiment may include elements substantially the same as those of the impedance measurement jig 100 in FIG. 1 except for a connection between a cover plate and a plug. Thus, the same reference numerals may refer to the same elements and any further illustrations with respect to the same elements may be omitted herein for brevity.

Referring to FIGS. 13 to 16, the plug 130 may be detachably combined with the cover plate 120. The plug 130 may be movably inserted into the hole 122 of the cover plate 120, such that a gap may be provided between the hole 122 and the plug 130. Positions of the plug 130 in the hole 122 may be adjusted by the gap.

Further, before inserting the plug 130 into the hole 122, an interior of the chamber C may be recognized through the hole 122.

A plurality of clamps 150 may be installed at the cover plate 120. The clamps 150 may be arranged at the central portion of the upper surface of the cover plate 120 around the hole 122, to fix the plug 130 in the hole 122. The clamps 150 may include toggle clamps, for example.

Figure 17:
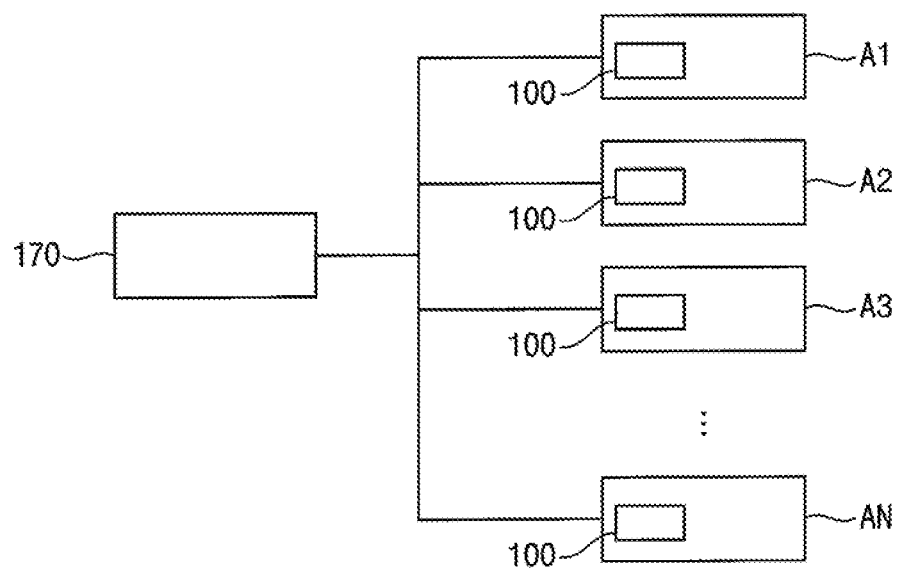
FIG. 17 is a view illustrating an impedance measurement jig in accordance with example embodiments applied to a plurality of the substrate-processing apparatuses.

FIG. 17 is a view illustrating an impedance measurement jig in accordance with example embodiments applied to a plurality of the substrate-processing apparatuses.

Referring to FIG. 17, the impedance measurement jig 100 in FIGS. 1 and 2 may be applied to a plurality of substrate-processing apparatuses A1, A2, A3, . . . , AN.

Impedances of the ESC E and the focus ring F in each of the substrate-processing apparatuses A1~AN may be measured using the impedance measurement jig 100, and may be transmitted to the analyzer 170.

The analyzer 170 may compare impedance ratios by the substrate-processing apparatuses with each other. The analyzer 170 may determine whether a difference between the impedance ratios by the substrate-process apparatuses is within an allowable range or not. When an impedance ratio of any one among the substrate-process apparatuses is beyond the allowable range by the analyzer 170, the ESC E and/or the focus ring R in the corresponding substrate-processing apparatus may be inspected.

Figure 18:
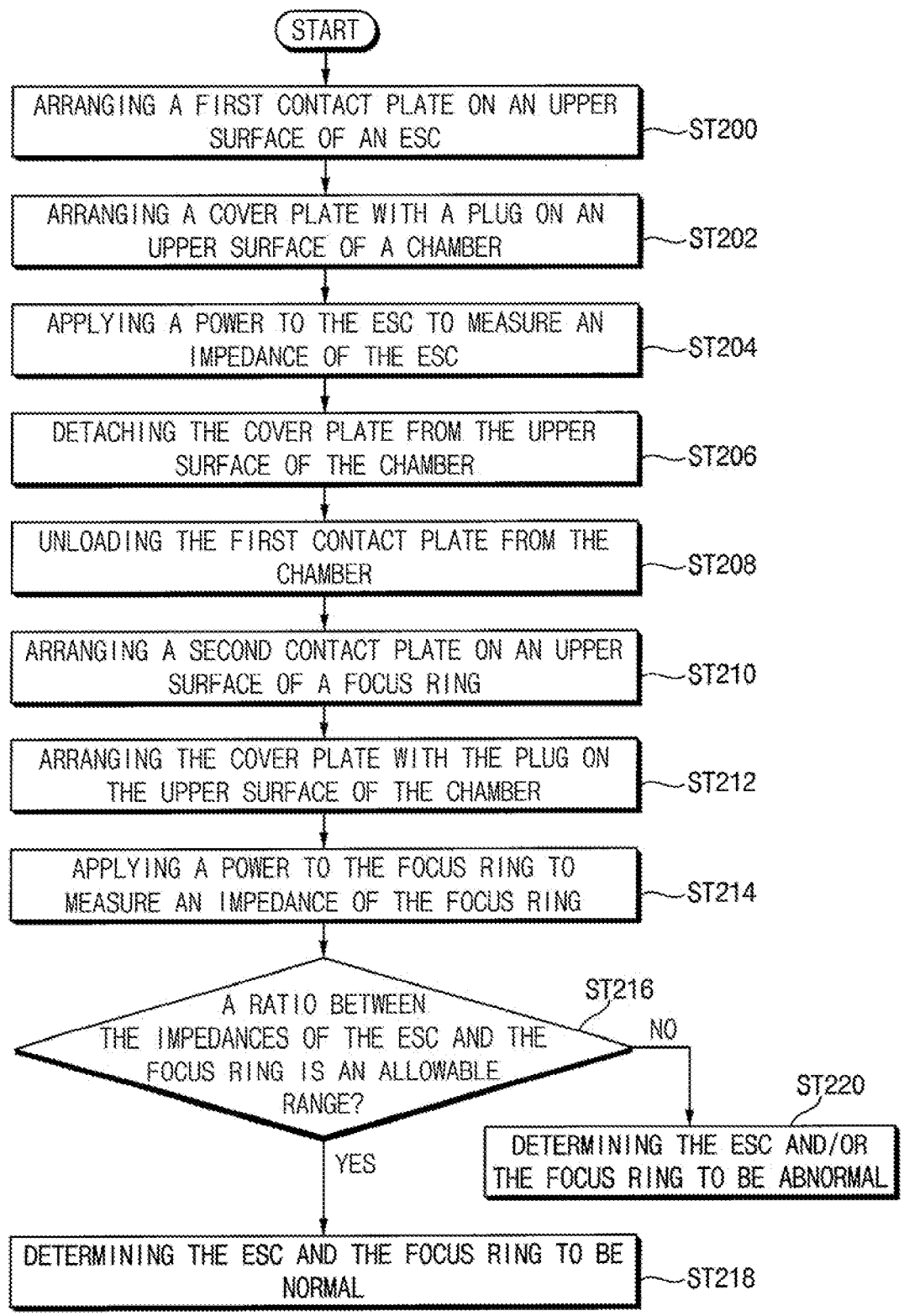
FIG. 18 is a flow chart illustrating a method of controlling a substrate-processing apparatus using the impedance measurement jig in accordance with example embodiments.

FIG. 18 is a flow chart illustrating a method of controlling a substrate-processing apparatus using the impedance measurement jig in accordance with example embodiments.

Referring to FIG. 18, in operation ST200, the first contact plate 110 may be provided into the chamber C, and the first contact plate 110 may be placed on the upper surface of the ESC E.

In operation ST202, the cover plate 120 with the plug 130 may be arranged on the upper surface of the chamber C. The second connector 134 of the plug 130 may make electrical contact with the third connector 136 on the upper surface of the first contact plate 110. Thus, the ESC E may be electrically connected with the analyzer 170 through the first contact plate 110 and the plug 130. The downward movement of the second connector 134 may be guided toward the third connector 136 by the guide 144.

In the case that the plug 130 in FIG. 15 has the above-described structure in which it is detached from the cover plate 120, the plug 130 may be inserted into the hole 122 of the cover plate 120. The plug 130 may then be fixed to the cover plate 120 using the clamp 150.

In operation ST204, the analyzer 170 may apply the power to the ESC E through the plug 130 and the first contact plate 110. The analyzer 170 may measure the impedance between the first contact plate 110 and the cover plate 120, i.e., the impedance of the ESC E.

In operation ST206, after completing the impedance measurement of the ESC E, the cover plate 120 may be detached from the upper surface of the chamber C.

In operation ST208, after detaching the cover plate 120, the first contact plate 110 may be unloaded from the chamber C.

In operation ST210, the second contact plate 160 may be provided into the chamber C, and the second contact plate 160 may be placed on the upper surface of the focus ring F.

In operation ST212, the cover plate 120 with the plug 130 may be arranged on the upper surface of the chamber C. The second connector 134 of the plug 130 may make electrical contact with the third connector 136 on the upper surface of the second contact plate 160. Thus, the focus ring F may be electrically connected with the analyzer 170 through the second contact plate 160 and the plug 130. The downward movement of the second connector 134 may be guided toward the third connector 136 by the guide 144.

As described above, when the plug 130 in FIG. 15 has the structure that is detached from the cover plate 120, the plug 130 may be inserted into the hole 122 of the cover plate 120. The plug 130 may then be fixed to the cover plate 120 using the clamp 150.

In operation ST214, the analyzer 170 may apply the power to the focus ring F through the plug 130 and the second contact plate 160. The analyzer 170 may measure the impedance between the second contact plate 160 and the cover plate 120, i.e., the impedance of the focus ring F.

In operation ST216, the analyzer 170 may determine whether a ratio between the measured impedances is within the allowable range or not.

In operation ST218, when the measured impedance ratio is within the allowable range, the analyzer 170 may determine the ESC E and the focus ring F to be normal.

In contrast, when the measured impedance ratio is beyond the allowable range, in operation ST220, the analyzer 170 may determine the ESC E and/or the focus ring F to be abnormal. Thus, the inspection of the ESC E and/or the focus ring F may then be performed.

In example embodiments, after measuring the impedance of the ESC E, the impedance of the focus ring F may then be measured. Alternatively, after measuring the impedance of the focus ring F, the impedance of the ESC E may then be measured.

Further, the method of controlling the substrate-processing apparatus using the impedance measurement jig may be performed before a process using the substrate-processing apparatus and/or after a process using the substrate-processing apparatus.

By way of summation and review, in general, power may be applied to the substrate-processing apparatus to measure an impedance of the total substrate-processing apparatus, i.e., an impedance of the chamber. The distribution of the plasma may be controlled based on the impedance of the chamber, but in this case respective impedances of parts such as the ESC, the focus ring, etc., in the substrate-processing apparatus may not be individually measured. Therefore, if the plasma distribution is abnormal, a reason of the abnormal plasma distribution as being caused by any one of the parts may not be accurately recognized.

According to an example embodiment, a semiconductor substrate may be arranged on an electrostatic chuck (ESC) in a chamber of the substrate-processing apparatus. A focus ring may be configured to surround the ESC to concentrate the plasma on an upper surface of the semiconductor substrate. In the process for forming the layer on the semiconductor substrate or for etching the layer to form the pattern using the plasma, thickness uniformity of the layer or the pattern may be greatly dependent upon a distribution of the plasma over the semiconductor substrate. Impedance of the substrate-processing apparatus may be an important factor for determining the distribution of the plasma. Thus, it may be desirable to accurately measure the impedance of the substrate-processing apparatus.

As described above, embodiments relate to a jig configured to measure impedances of an electrostatic chuck and a focus ring in a substrate-processing apparatus, and a method of controlling the substrate-processing apparatus using the jig. Embodiments may provide a jig that may be capable of accurately measuring impedances of an ESC and a focus ring in a substrate-processing apparatus. Embodiments also provide a method of controlling a substrate-processing apparatus based on impedances measured using the above-described jig.

According to example embodiments, because the impedance measurement jig may selectively include the first contact plate (configured to make electrical contact with the ESC) and the second contact plate (configured to make electrical contact with the focus ring), the impedance of the ESC may be measured using only the first contact plate, and the impedance of the focus ring may be measured using only the second contact plate. Thus, the impedances of the ESC and the focus ring may be individually measured. As a result, the ESC and/or the focus ring of the substrate-processing apparatus may be inspected based on the measured impedances.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An impedance measurement jig for a substrate-processing apparatus, the impedance measurement jig comprising:
   a first contact plate configured to make electrical contact with an electrostatic chuck (ESC) in the substrate-processing apparatus;
   a second contact plate configured to make electrical contact with a focus ring surrounding the ESC;
   a cover plate configured to cover an upper surface of the substrate-processing apparatus;
   a plug installed at the cover plate, the plug being configured to selectively make contact with the first contact plate and the second contact plate; and
   an analyzer individually applying a power to the first contact plate through the plug to measure an impedance of the ESC and applying a power to the second contact plate through the plug to measure an impedance of the focus ring.

2. The impedance measurement jig as claimed in claim 1, wherein the first contact plate has a flat lower surface configured to make contact with a whole upper surface of the ESC.

3. The impedance measurement jig as claimed in claim 1, wherein:
   the first contact plate includes a flexible conductive material, and
   a height-correction groove, configured to be spaced apart from an upper surface of the ESC, is formed at a lower surface of the first contact plate.

4. The impedance measurement jig as claimed in claim 1, wherein the first contact plate includes a protection film attached to a lower surface of the first contact plate that is configured to make contact with an upper surface of the ESC.

5. The impedance measurement jig as claimed in claim 1, wherein the second contact plate includes a protection film attached to a lower surface of the second contact plate that is configured to make contact with an upper surface of the focus ring.

6. The impedance measurement jig as claimed in claim 1, wherein the plug includes:
   a first connector received in a hole of the cover plate, and electrically connected with the analyzer;
   a second connector connected to a lower end of the first connector, and configured to be electrically connected with the first contact plate or the second contact plate;
   a first holder configured to fix the second connector to the cover plate; and
   a second holder configured to fix the first connector to the first holder.

7. The impedance measurement jig as claimed in claim 6, wherein the plug further includes a third connector installed at an upper surface of the first contact plate and an upper surface of the second contact plate, and configured to make electrical contact with a lower end of the second connector.

8. The impedance measurement jig as claimed in claim 7, wherein the plug further includes a guide having a funnel shape, the guide being configured to surround the third connector to guide the lower end of the second connector toward an upper end of the third connector.

9. The impedance measurement jig as claimed in claim 1, wherein the plug is integrally formed with the cover plate.

10. The impedance measurement jig as claimed in claim 1, wherein the plug is detachably inserted into a hole formed through the cover plate.

11. The impedance measurement jig as claimed in claim 10, further comprising at least one clamp installed at the cover plate to fix the plug in the hole.

12. The impedance measurement jig as claimed in claim 1, wherein the cover plate includes at least one handle installed at an upper surface of the cover plate.

13. The impedance measurement jig as claimed in claim 1, further comprising at least one resilient member installed at a lower surface of the cover plate to resiliently support the first contact plate or the second contact plate in a downward direction.

14. The impedance measurement jig as claimed in claim 1, wherein the cover plate includes a flexible material.

15. The impedance measurement jig as claimed in claim 14, wherein the cover plate includes:
   a central plate configured to receive the plug;
   a rim configured to surround the central plate; and
   a plurality of ribs connected between the rim and the central plate.

16. The impedance measurement jig as claimed in claim 1, wherein the analyzer is configured to determine whether a ratio between the impedance of the ESC and the impedance of the focus ring is within an allowable range or not.

* * * * *